US006670684B2

United States Patent
Ikeda

(10) Patent No.: US 6,670,684 B2
(45) Date of Patent: Dec. 30, 2003

(54) SEMICONDUCTOR DEVICE HAVING LINE-AND-SPACE PATTERN GROUP

(75) Inventor: Osamu Ikeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/278,756

(22) Filed: Oct. 22, 2002

(65) Prior Publication Data

US 2003/0075801 A1 Apr. 24, 2003

(30) Foreign Application Priority Data

Oct. 22, 2001 (JP) ...................................... P2001-324144

(51) Int. Cl.[7] .............................................. H01L 29/76
(52) U.S. Cl. ..................... 257/401; 257/315; 257/758
(58) Field of Search ................................ 257/315, 401, 257/758; 438/669, 926, 642

(56) References Cited

U.S. PATENT DOCUMENTS 6,531,357 B2 * 3/2003 Takeuchi et al. ............ 438/266

FOREIGN PATENT DOCUMENTS

JP 2000-164734 6/2000

* cited by examiner

Primary Examiner—Tom Thomas
Assistant Examiner—Thomas Magee
(74) Attorney, Agent, or Firm—Hogan & Hartson, LLP

(57) ABSTRACT

A first insulating film is formed on a semiconductor substrate. A first pattern group having a plurality of first conductors respectively having a first width and separated from each other by a first interval is formed on the first insulting film. A second conductor having a second width larger than the first width is formed separately from a first conductor of the plurality of first conductors at an end of the first pattern group by a first distance in parallel with the plurality of first conductors. A third conductor having a width equal to the second width is formed on the same side as the second conductor with respect to the first pattern group and separated from the first conductor by the first distance. A fourth conductor having a width equal to the second width is formed between the second and third conductors and separated from the first conductor by the first distance.

18 Claims, 13 Drawing Sheets

| A1, A2 | B | Sa | Sb |
|---|---|---|---|
| 0.3 | 1.4 | 0.155 | 0.154 |
| 0.4 | 1.2 | 0.152 | 0.154 |
| 0.5 | 1.0 | 0.148 | 0.153 |
| 0.6 | 0.8 | 0.144 | 0.152 |

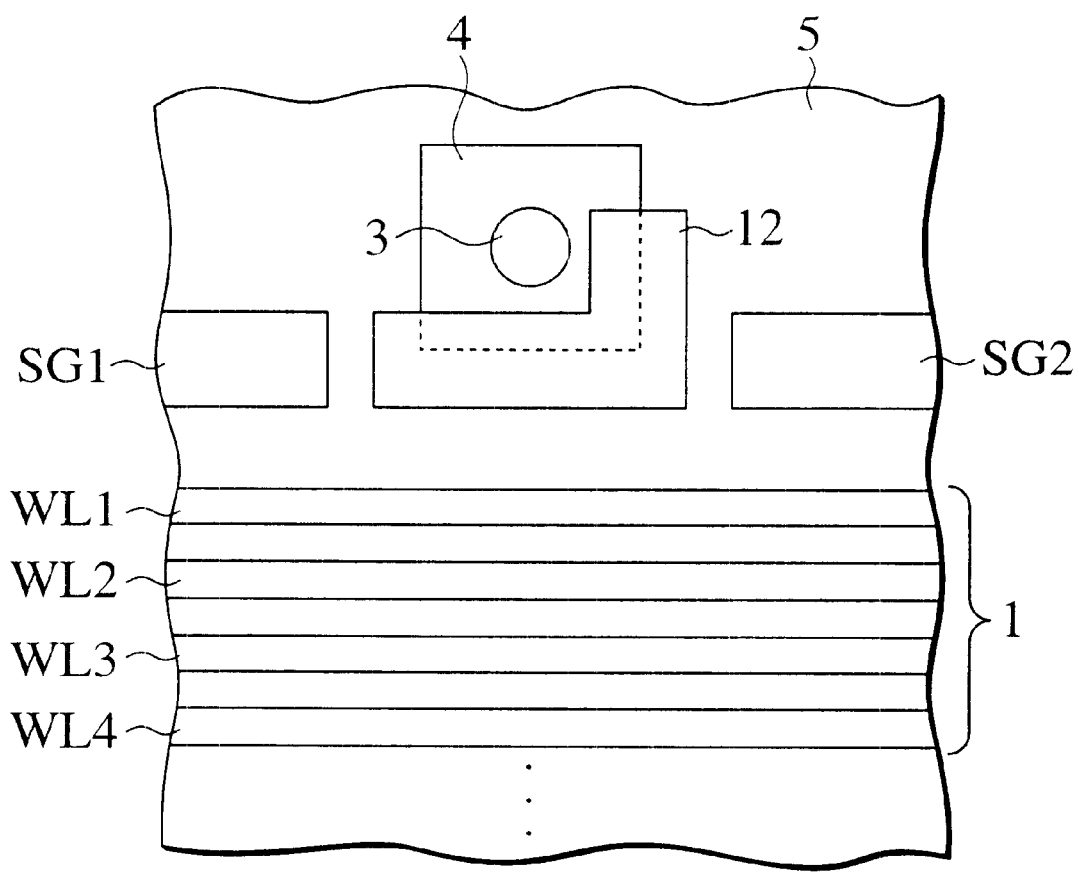

SEMICONDUCTOR DEVICE HAVING LINE-AND-SPACE PATTERN GROUP

CROSS REFERENCE TO RELATED APPLICATIONS

This application is based upon and claims the benefit of priority from prior Japanese Patent Application P2001-324144 filed on Oct. 22, 2001; the entire contents of which are incorporated by reference herein.

BACKGROUND OF THE INVENTION

The present invention relates to a semiconductor device having a periodic line-and-space pattern group. Particularly, the present invention relates to a semiconductor device in which a periodic line-and-space pattern group is adjacent to a pattern having different periodicity.

The semiconductor device has a plurality of memory transistors. The memory transistors have a plurality of gate wirings. The gate wirings are periodically positioned. It is preferable that widths of the gate wirings are equal, and that intervals between the gate wirings are equal. However, when the gate wirings are regarded as one pattern group, the width and interval of a gate wiring located at an end of the pattern group may differ from the widths and intervals of the rest of the gate wirings.

Therefore, previously, a dummy pattern having the same width and the same interval as the gate wirings of the pattern group has been formed adjacent to the end of the pattern group. All gate wirings of the pattern group were arranged with the same widths and at the same intervals. However, because the dummy pattern is set to a semiconductor memory, a problem is generated in that the area of the semiconductor memory increased.

SUMMARY OF THE INVENTION

A semiconductor device according to embodiments of the present invention includes a semiconductor substrate, a first insulating film formed on the semiconductor substrate, a first pattern group having a plurality of first conductors formed on the first insulting film, respectively, having a first width and separated from each other by a first interval, a second conductor formed separately from a first conductor of the plurality of first conductors at an end of the first pattern group by a first distance in parallel with the plurality of first conductors and having a second width larger than the first width, a third conductor formed on the same side as the second conductor with respect to the first pattern group and separated from the first conductor by the first distance and having a width equal to the second width, and a fourth conductor formed between the second and third conductors and separated from the first conductor by the first distance and having a width equal to the second width.

A semiconductor device according to embodiments of the present invention includes a semiconductor substrate, a first memory cell array having a plurality of first gate wirings in parallel with each other formed on the semiconductor substrate and separated from each other by an interval and respectively having a first width, a first select transistor having a second gate wiring with a second width different from the first width and formed on the semiconductor substrate adjacent to the first memory cell array in parallel with the first gate wirings, a second select transistor having a third gate wiring formed on the semiconductor substrate adjacent to the first memory cell array on the same side as the first select transistor with respect to the first memory cell array on an extension line of the second gate wiring, and a dummy pattern formed adjacent to the first memory cell array between the second gate wiring and the third gate wiring in parallel with the first gate wirings and having a width equal to the second width.

BRIEF DESCRIPTION OF THE DRAWINGS

FIG. 5 is a perspective view of the lowest surface wiring layer when seen through an upper metal interconnect layer and an interlayer dielectric film of a semiconductor device of a modification of the second embodiment of the present invention;

Figure 8A:
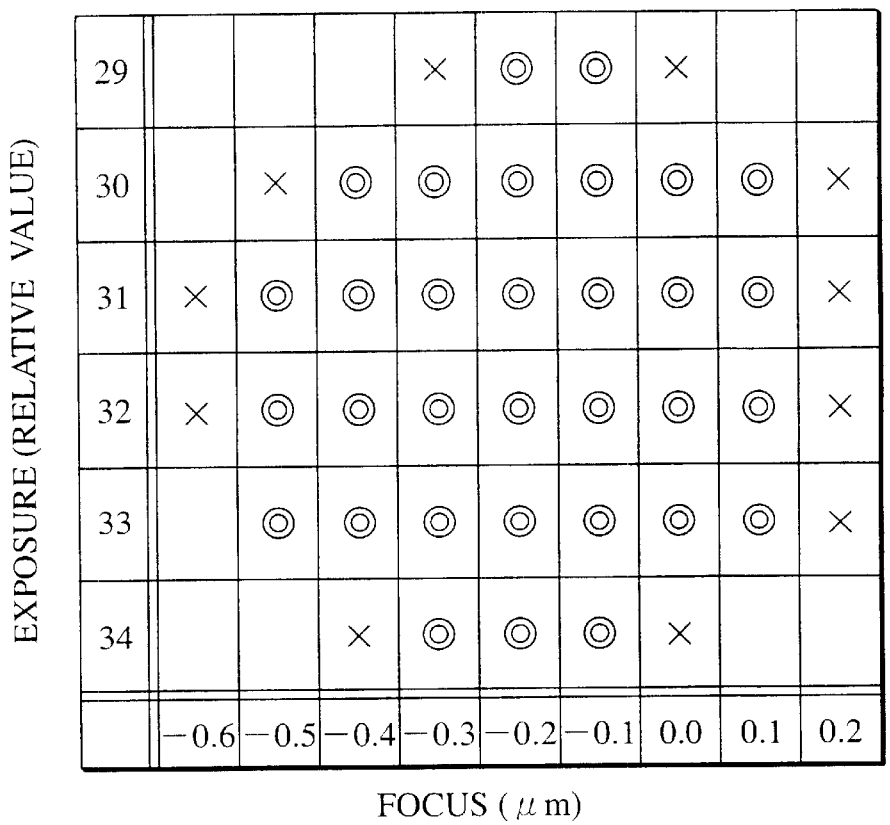
FIG. 8A is an illustration showing relations between exposure conditions of the semiconductor device and acceptance or rejection of line widths of gate wirings WL1 to WL4 and WL11 to WL14 to the specification of the third embodiment of the present invention.
Figure 8B:
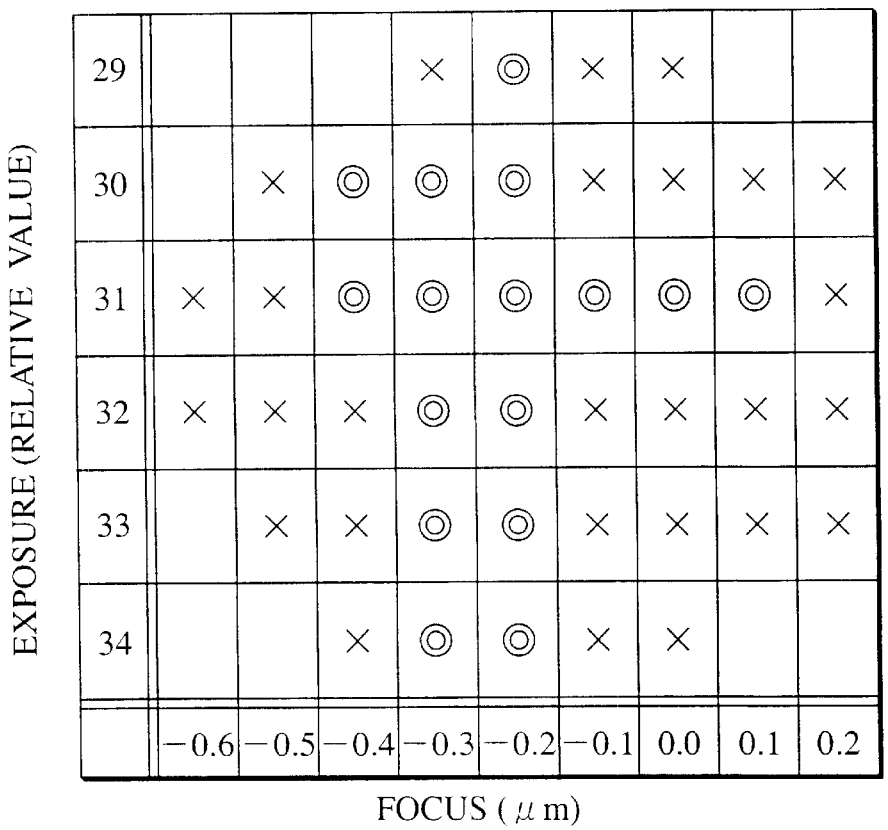
Figure 9:
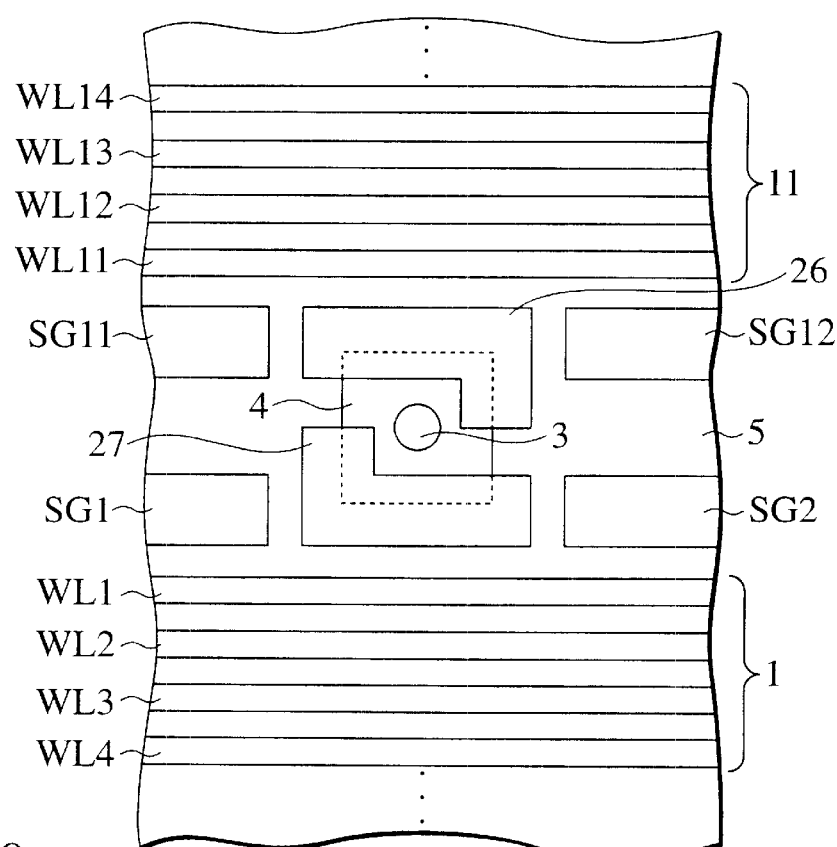
Figure 10:
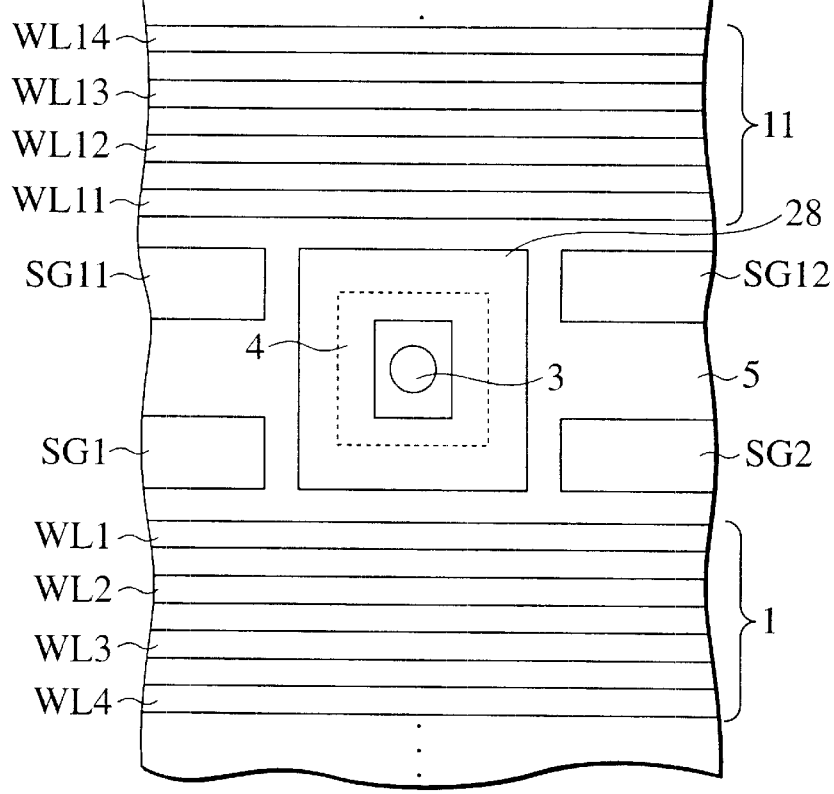
Figure 11:
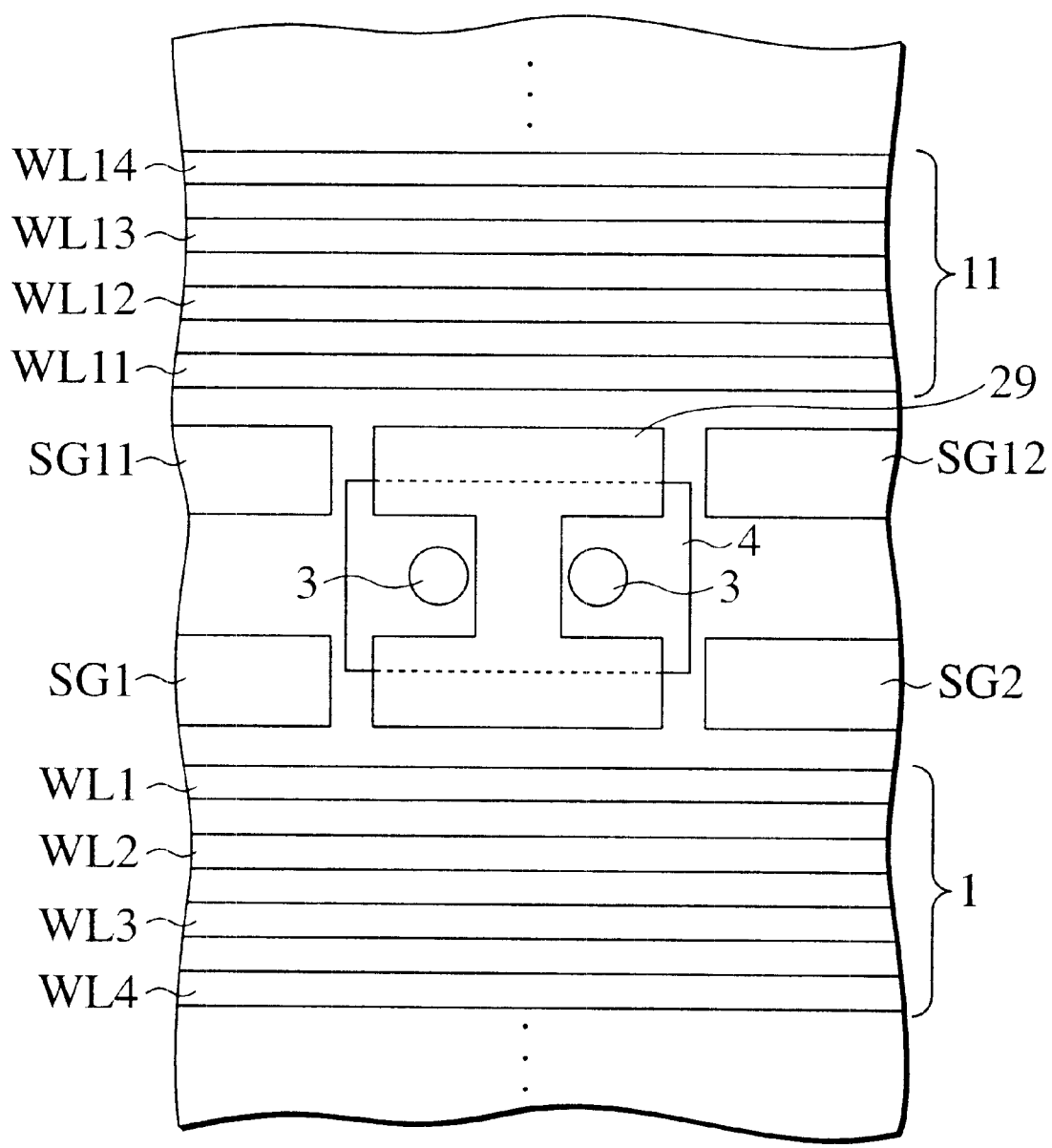
Figure 12A:
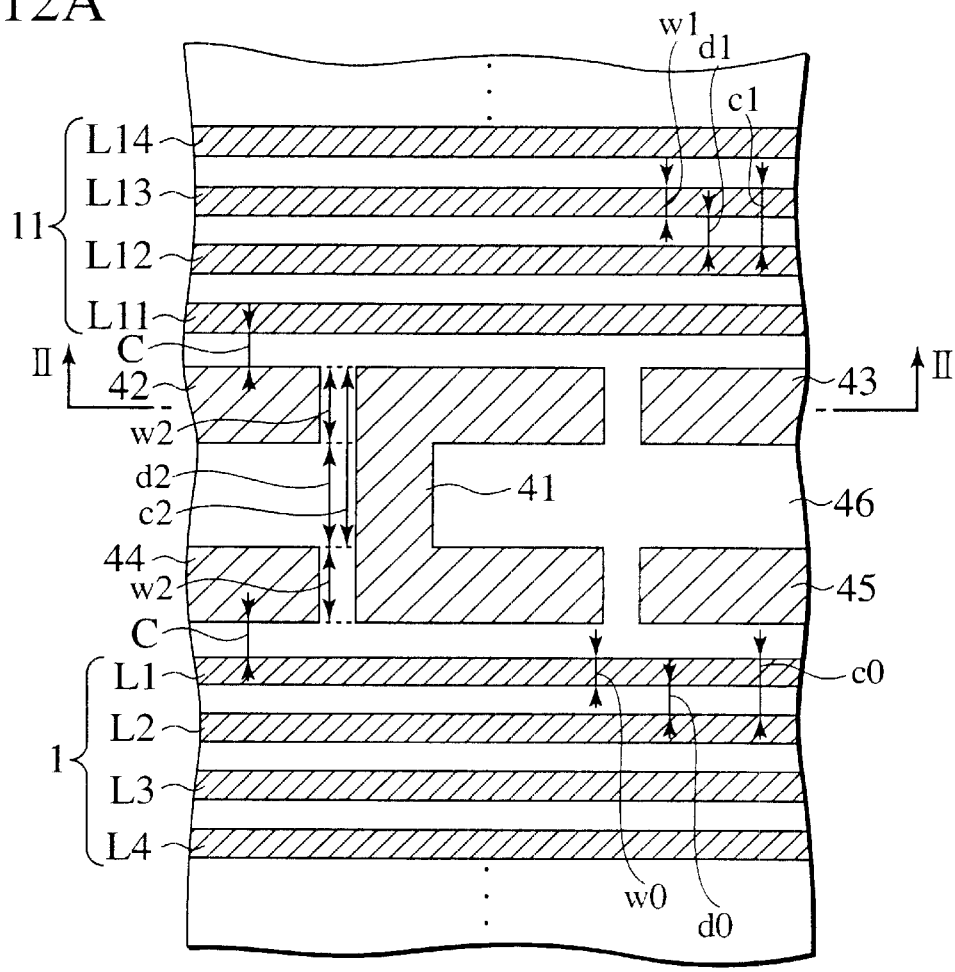
Figure 12B:
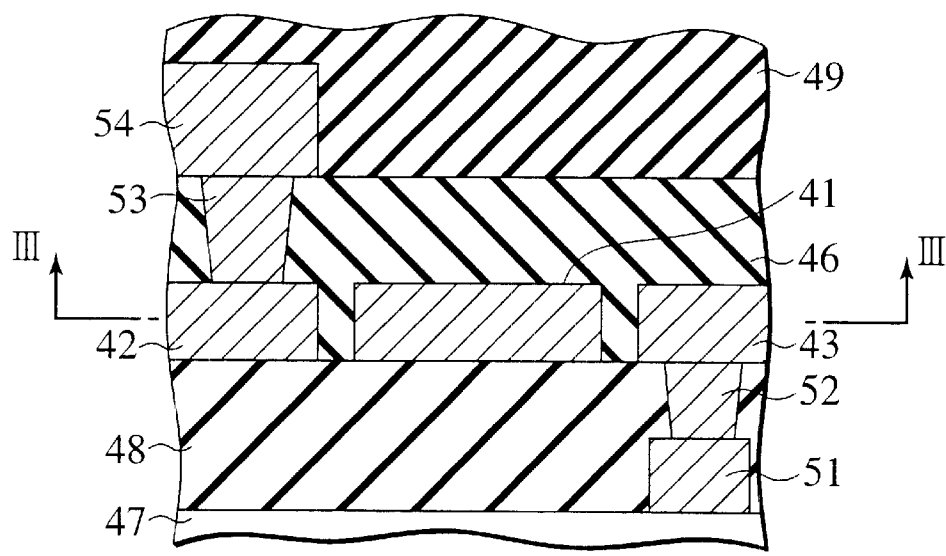

FIG. 8B is an illustration showing relations between exposure conditions of a reference semiconductor device excluding a dummy pattern 22 from the semiconductor device of the third embodiment of the present invention and acceptance or rejection of gate wirings to the specification;

FIG. 9 is a perspective view noting the lowest surface wiring layer when seen through an upper metal interconnect layer and an interlayer dielectric film of the semiconductor device of first modulation of the third embodiment of the present invention;

FIG. 10 is a perspective view noting the lowest surface wiring layer when seen through an upper metal interconnect layer and an interlayer dielectric film of the semiconductor device of second modulation of the third embodiment of the present invention;

FIG. 11 is a perspective view noting the lowest surface wiring layer when seen through an upper metal interconnect layer and an interlayer dielectric film of the semiconductor device of third modulation of the third embodiment of the present invention;

FIG. 12A is a sectional view of a semiconductor device of fourth embodiment of the present invention in the III—III direction of FIG. 12B; and FIG. 12B is a sectional view of the semiconductor device of the fourth embodiment in the II—II direction of FIG. 12A.

DETAILED DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

COMPARATIVE EXAMPLE

Figure 1A:
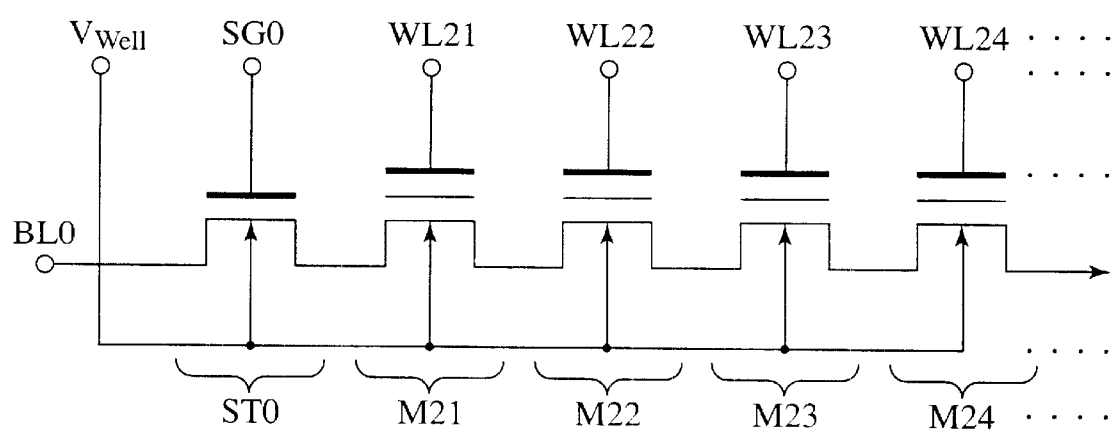
FIG. 1A is a circuit diagram of a NAND electrically erasable programmable read only memory (EEPROM) of an embodiment of the present invention.
Figure 1B:
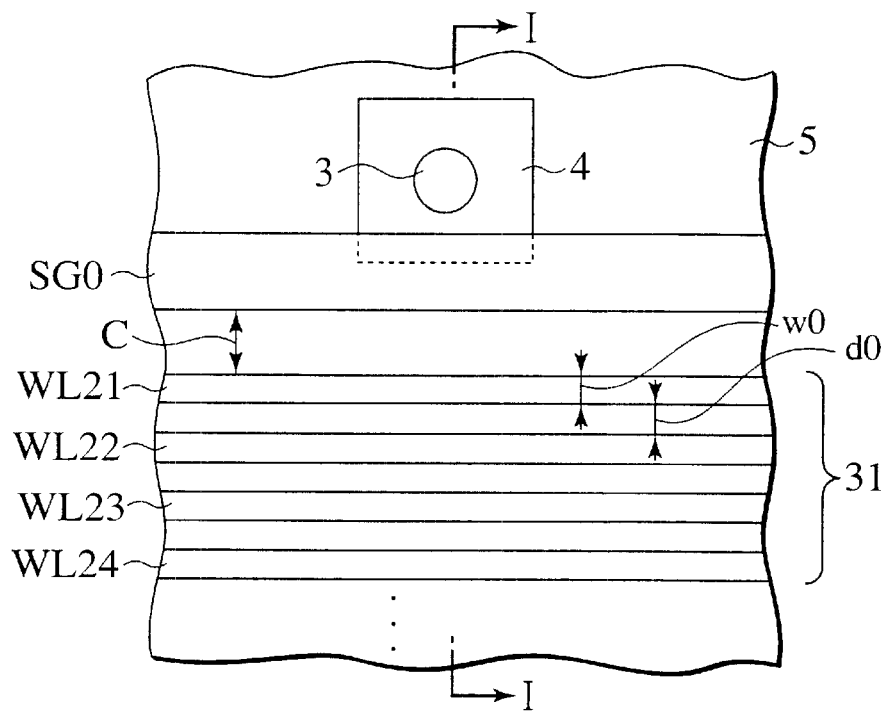
FIG. 1B is a perspective view noting the lowest surface wiring layer when seen through an upper metal interconnect layer and an interlayer dielectric film of the NAND EEPROM of an embodiment of the present invention.
Figure 1C:
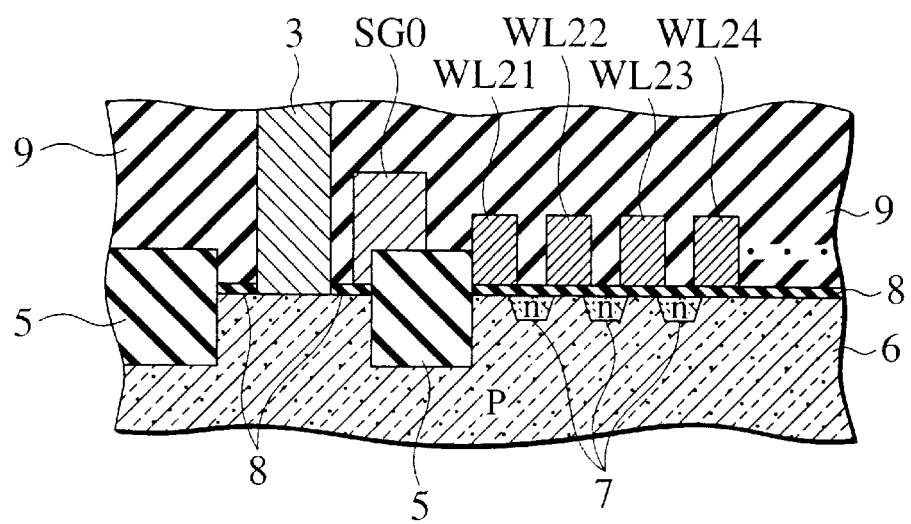
FIG. 1C is a sectional view of the NAND EEPROM of an embodiment of the present invention in the I—I direction of FIG. 1B.

A NAND EEPROM representative of semiconductor memories of embodiments of the present invention is described below. As shown in FIG. 1A, the NAND EEPROM has a plurality of memory cell transistors M21 to M24 and a select transistor ST0. Moreover, as shown in FIGS. 1A, 1B, and 1C, the memory transistors M21 to M24 have a plurality of gate wirings WL21 to WL24 respectively. The select transistor ST0 has a gate wiring SG0. Source-drain regions 7 of the select transistor ST0 and memory-cell transistors M21 to M24 are connected in series to serve as a bit line BL0. Substrate potentials of the select transistor ST0 and memory-cell transistors M21 to M24 are equal to the potential $V_{well}$ of a well 6. The potential $V_{well}$ of the well 6 can be controlled externally of the NAND EEPROM through a contact plug 3.

Gate wirings WL21 to WL24 of memory cell transistors M21 to M24 are arranged periodically. Widths w0 of the gate wirings WL21 to WL24 are equal to each other. Intervals d0 between the gate wirings WL21 to WL24 are equal to each other. Moreover, the gate wirings WL21 to WL24 form a line-and-space pattern group 31. A gate insulating film 8 is formed below the gate wirings WL21 to WL24 on the well 6. Source-drain regions 7 of a plurality of memory-cell transistors are formed in a region including the surface contacting the gate-insulating film 8 of the well 6. The type of conductivity of the source-drain region 7 is different from that of the well 6. An interlayer dielectric film 9 is formed on the gate wirings WL21 to WL24 and on the gate wiring SG0.

The gate wiring SG0 of the select transistor ST0 is formed in parallel with the gate wiring WL21 and adjacent to the gate wiring WL21. The contact plug 3 is adjacent to the gate wiring SG0. The contact plug 3 and the well 6 are electrically connected. Therefore, an active area 4 is formed under the plug 3. The active area 4 is a part of the well 6. An isolation region 5 is formed around the active area 4. The isolation region 5 is implemented by a shallow trench isolation (STI) structure or is formed by local oxidation of silicon (LOCOS) method. The pattern group 31, gate wiring SG0, and contact plug 3 are adjacently arranged in order to decrease the chip area of the NAND EEPROM. Moreover, in order to decrease the chip area, the gate wiring SG0 is formed on the active area 4.

First Embodiment

In the above-mentioned semiconductor device, the gate wiring SG0 is formed on the boundary between the active area 4 and isolation region 5 as shown in FIG. 1A and FIG. 1B. Because stresses often concentrate on or along the boundary, defects may be generated. When a defect is generated, it may cause a leakage current to flow between the gate wiring SG0 and well 6 through the defect.

Figure 2A:
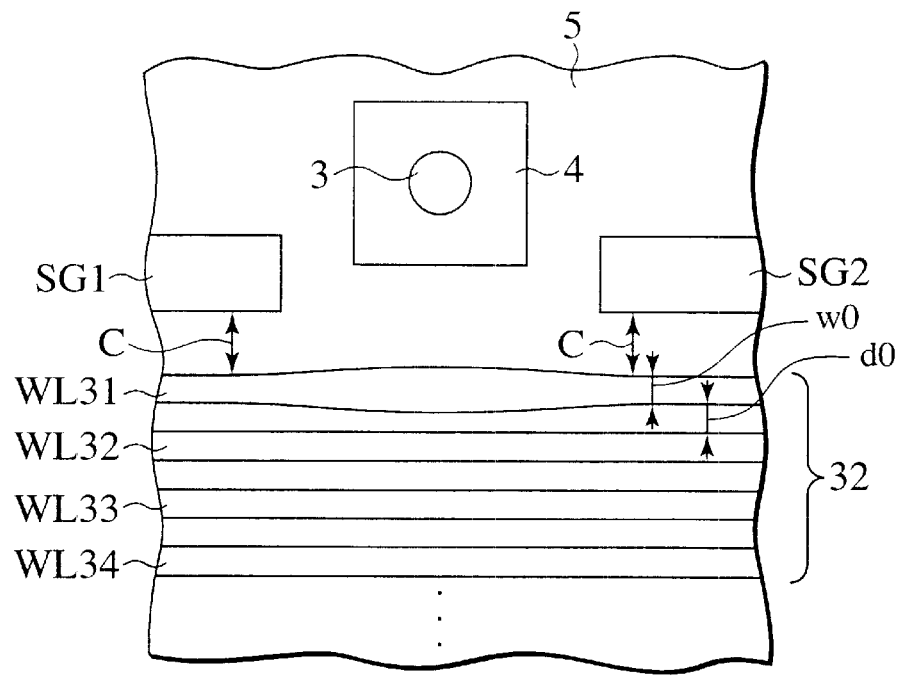
FIGS. 2A and 2B are perspective views noting the lowest surface wiring layer when seen through an upper metal interconnect layer and an interlayer dielectric film of a semiconductor device of first embodiment of the present invention.
Figure 2B:
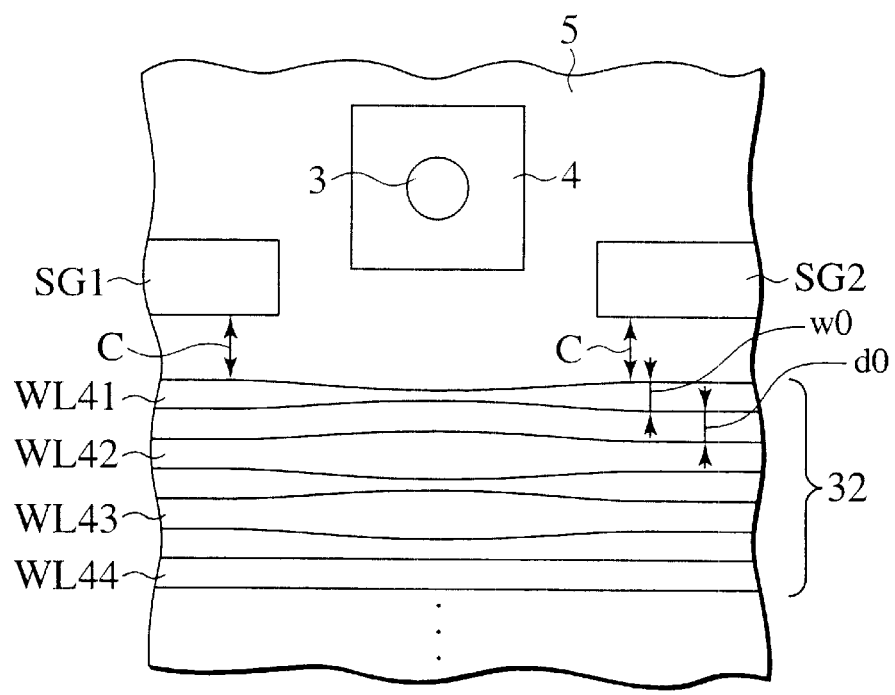

As shown in FIG. 2A and FIG. 2B, in a semiconductor device of the first embodiment, the gate wiring SG0 is not formed on the interface between the active area 4 and isolation region 5. Thereby, even if a defect is generated, no leakage current will flow between the gate wiring SG0 and well 6.

Figure 2C:
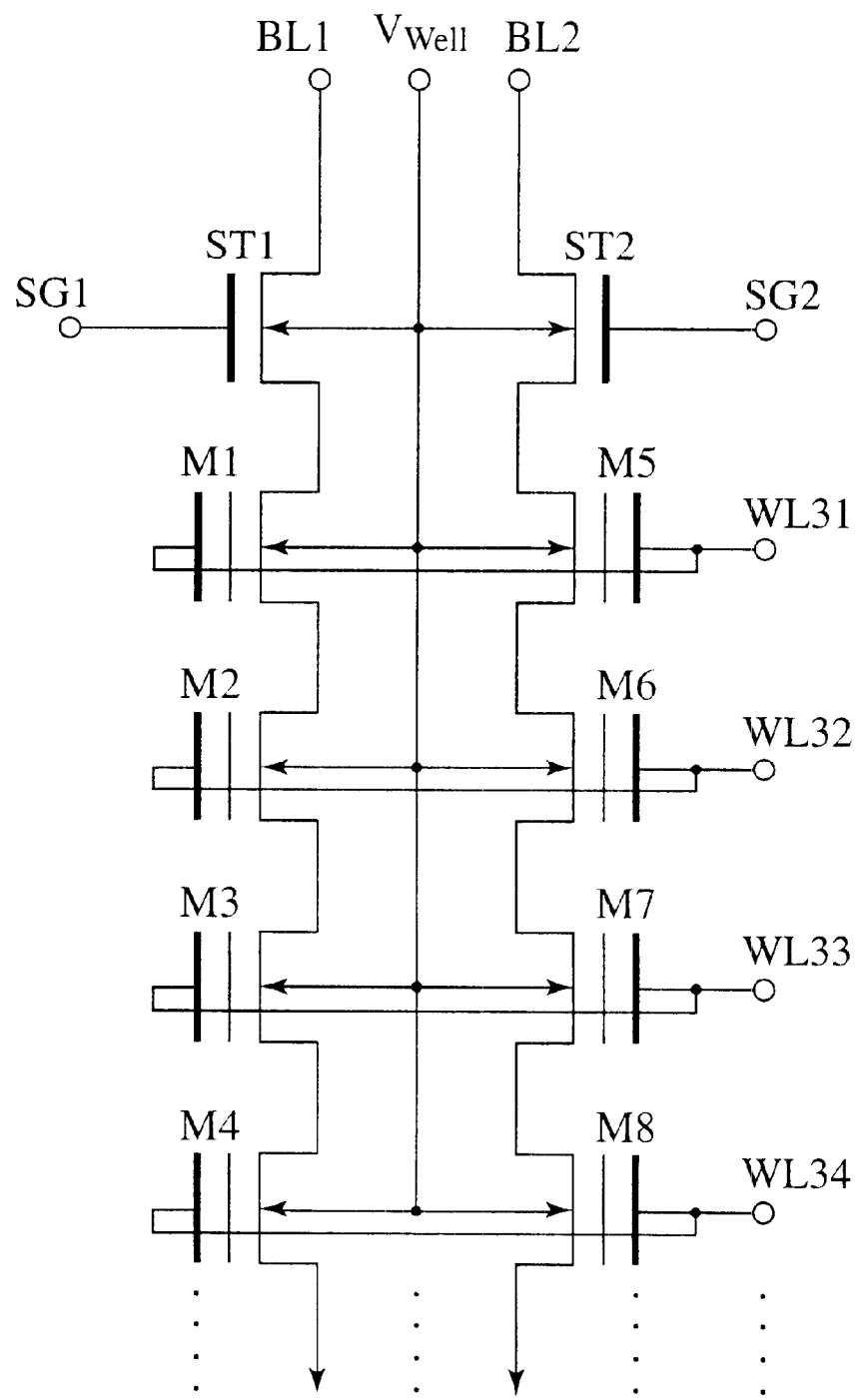
FIG. 2C is a circuit diagram of the semiconductor device of the first embodiment of the present invention shown in FIG. 2A.

As shown in FIG. 2C, the semiconductor device of the first embodiment has a plurality of memory cell transistors M1 to M8 and a plurality of select transistors ST1 and ST2. As shown in FIGS. 2A and 2C, the memory cell transistors M1 and M5 share a gate wiring WL31. The memory cell transistors M2 and M6 share a gate wiring WL32. The memory cell transistors M3 and M7 share a gate wiring WL33. The memory cell transistors M4 and M8 share a gate wiring WL34. The select transistor ST1 has a gate wiring SG1. The select transistor ST2 has a gate wiring SG2.

Source-drain regions of the select transistor ST1 and memory cell transistors M1 to M4 are connected in series to serve as a bit line BL1. Source-drain regions of the select transistor ST2 and memory-cell transistor M5 to M8 are connected in series to serve as a bit line BL2. Substrate potentials of the select transistors ST1 and ST2 and memory cell transistors M1 to M8 are equal to the potential $V_{well}$ of a well 6. It is possible to control the potential $V_{well}$ of the well 6 externally of a semiconductor device through the contact plug 3.

The gate wirings WL31 to WL34 are respectively periodic line-and-space patterns. The gate wirings WL31 to WL34 are arranged at an equal width w0 and an equal space interval d0. Moreover, the gate wirings WL31 to WL34 form a wiring pattern group 32. The select transistors ST1 and ST2 and the gate wirings SG1 and SG2 are divided in two. A gap is formed between the gate wirings SG1 and SG2. The width of the gap between the gate wirings SG1 and SG2 is larger than the width of the active area 4.

Thereby, neither the gate wiring SG1 nor SG2 are formed on the active area 4. Nether the gate wiring SG1 nor SG2 are formed on the boundary between the active area 4 and the isolation region 5. Therefore, even if a defect is generated produced on the boundary, no leakage current flows between the gate wirings SG1 and SG2 on the one hand and the well 6 on the other. Moreover, it is possible to decrease the chip area to the same as the semiconductor device of the comparative example.

The gate wirings SG1 and SG2 are adjacent to the gate wiring WL31. The gate wirings SG1 and SG2 are arranged in parallel with the gate wiring WL31, separately from the wiring WL31 by a distance c. The positions of the contact plug 3 and the active area 4 with respect to the wiring pattern group 32 is the same as that of the contact plug 3 and the active area 4 with respect to the wiring pattern group 31 in FIG. 1B.

Second Embodiment

With respect to the wiring WL31 of the semiconductor device of the first embodiment, a rarely observed situation as shown in FIG. 2A, is that the line width of a portion Where the wirings SG1 and SG2 are not adjacently arranged is larger than the line width w0 of the portion where the wirings SG1 and SG2 are adjacently arranged. The separated gate wirings SG1 and SG2 having a discontinuous portion are adjacent to the wiring WL31. It is estimated that the increase in the line width is due to scattering of light in the discontinuous portion made by lithography for forming the wirings WL31 to WL34.

In another observation of the semiconductor device of the first embodiment, the line widths of the wirings WL41 to WL43 fluctuate as shown in FIG. 2B. However, the line width of the wiring WL44 does not fluctuate. For the wiring WL41, the line width of a portion where the wiring patterns SG1 and SG2 are not adjacently arranged is less than the line width w0 of a portion where the wiring patterns SG1 and SG2 are adjacently arranged. With regard to the wirings WL42 and WL43, the line widths of portions where the wirings SG1 and SG2 are not adjacently arranged is larger than the line widths w0 of portions where the wirings SG1 and SG2 are adjacently arranged.

It is estimated that the line widths increase or decrease because line widths of the wirings WL31, WL41, WL42, and WL43 are sensitive to fluctuations in exposure value and in focal position when the wirings WL31, WL41, WL42, and WL43 are exposed.

Dispersion of illuminance and dispersion of resist or antireflection film thickness are considered to be factors in fluctuation of the exposure value. Moreover, dispersion due to wafer flatness, lens aberration, and focus alignment error are considered to be factors in fluctuation of the focal position. It is thought that such dispersions are always present, to a slight degree. Such dispersions are acceptable provided that the line widths of the wirings WL31, WL41, WL42, and WL43 do not greatly fluctuate in response to the fluctuations in exposure value and focal position.

Figure 3A:
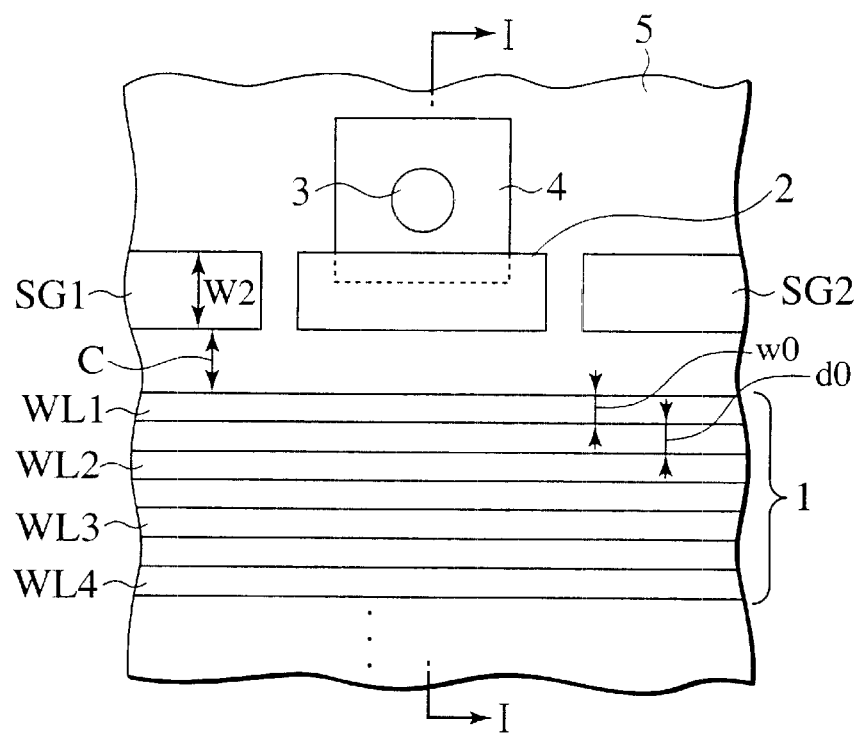
FIG. 3A is a perspective view noting the lowest surface wiring layer when seen through an upper metal interconnect layer and an interlayer dielectric film of a semiconductor device of second embodiment of the present invention.
Figure 3B:
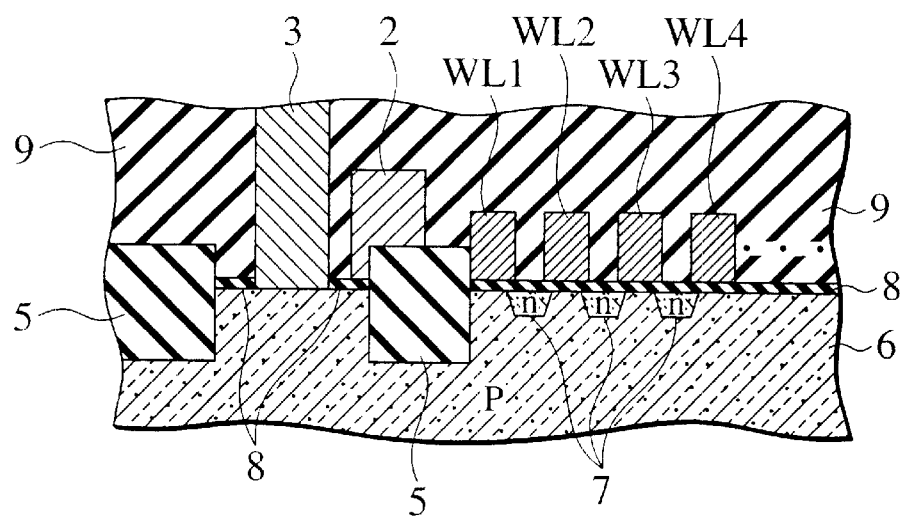
FIG. 3B is a sectional view of the semiconductor device of the second embodiment of the present invention in the I—I direction of FIG. 3A.

In view of the foregoing considerations, the semiconductor device of the second embodiment has a dummy pattern 2 as shown in FIG. 3A and FIG. 3B.

The circuit diagram of the semiconductor device of the second embodiment is the same as that of the semiconductor device of the first embodiment shown in FIG. 2C. Therein, the gate wirings WL31 to WL34 are replaced by the gate wirings WL1 to WL4. That is, as shown in FIG. 2C, the semiconductor device of the second embodiment has memory cell transistors M1 to M8 and the select transistors ST1 and ST2. As shown in FIG. 3A and FIG. 3B, the memory cell transistors M1 and M5 share the gate wiring WL1. The memory cell transistors M2 and M6 share the gate wiring WL2. The memory cell transistors M3 and M7 share the gate wiring WL3. The memory cell transistors M4 and M8 share the gate wiring WL4.

The gate wirings WL1 to WL4 are periodically arranged. The line widths w0 of the gate wirings WL1 to WL4 are equal to each other. The space intervals d0 of the gate wirings WL1 to WL4 are equal to each other. Moreover, the gate wirings WL1 to WL4 form a wiring pattern group 1. The gate wirings SG1 and SG2 of the select transistors ST1 and ST2 are arranged on the same straight line. The gate wirings SG1 and SG2 are arranged separately from each other. The dummy pattern 2 is disposed between the gate wirings SG1 and SG2. The gate wirings SG1 and SG2 are arranged in parallel with the gate wiring WL1. The gate wirings SG1 and SG2 are adjacent to the gate wiring WL1 by the distance c. The gate wirings SG1 and SG2 are arranged so as to be adjacent to the wiring pattern group 1 by the distance c. The line widths w2 of the gate wirings SG1 and SG2 is larger than the line widths w0 of the gate wirings WL1 to WL4.

The positions of the contact plug 3 and active area 4 with respect to the wiring pattern group 1 is the same as that of the contact plug 3 and active area 4 with respect to the wiring pattern group 1 in FIG. 1A. Thereby, it is possible to achieve miniaturization of a semiconductor device in the same manner as FIG. 1A.

The width of the gap between the gate wirings SG1 and SG2 is larger than the width of the active area 4. Thereby, neither the gate wiring SG1 nor SG2 are formed on the active area 4. Therefore, no leakage current flows between the gate wirings SG1 and SG2 on the one hand and the well 6 on the other.

The dummy pattern 2 is adjacent to the gate wiring WL1 of the group 1 by the distance c, which is the same as the gate wirings SG1 and SG2. The line width of the dummy pattern 2 is equal to the line widths w2 of the gate wirings SG1 and SG2. The shape of the dummy pattern 2 is as the same as the shape of the capital I of the alphabet.

As shown in FIG. 3B, the isolation region 5 is embedded in the well 6 formed in the upper portion of the semiconductor substrate. The upper face of the isolation region 5 is higher than the surface of the well 6. The source-drain region 7 of a memory cell transistor is formed in a region including the surface of the well 6. The source-drain region 7 is formed below each of the regions between the gate wirings WL1 and WL4. The gate insulating film 8 is formed on the surface of the well 6. The gate wirings WL1 to WL4 are formed on the gate insulating film 8. The contact plug 3 is formed on the well 6 in the active area 4.

The dummy pattern 2 is formed on the isolation region 5 and the gate-insulating film 8 of the active area 4. Upper and side faces of the gate wirings WL1 to WL4 are covered with the interlayer dielectric film 9. The upper and side faces of the dummy pattern 2 are also covered with the interlayer dielectric film 9. The dummy pattern 2 is a conductor pattern. The dummy pattern 2 is surrounded by insulators 5, 8, and 9 so as to achieve an electrically floating state. The dummy pattern 2 is insulated from the patterns WL1 to WL4 and SG1 and SG2 so that the potential of the dummy pattern 2 is floating with respect to the potential of the patterns WL1 to WL4 and SG1 and SG2. Thereby, even if the dummy pattern 2 is shorted from the well 6 due to a problem in the gate insulating film 8, no leakage current flows from the gate wiring WL1, SG1, or SG2 to the well 6 via the dummy pattern 2.

Due to the position of the dummy pattern 2, the fluctuation of the line widths w0 of the wiring patterns WL1, WL2, and WL3 are decreased. That is, the gate wirings WL1 to WL4 are formed with a constant periodicity (w0+d0), that is, an equal width w0 and equal interval d0. Moreover, the gate wirings WL1 to WL4 do not open and the gate wirings WL1 to WL4 do not short each other.

The active area 4 is formed below the dummy pattern 2. Because the dummy pattern 2 can be kept in the electrically floating-state, it is unnecessary to form the contact area for connecting the pattern 2 to the well 6. It is possible to make the width W2 of the dummy pattern 2 smaller than that of the contact area 3.

Figures 4A, 4B:
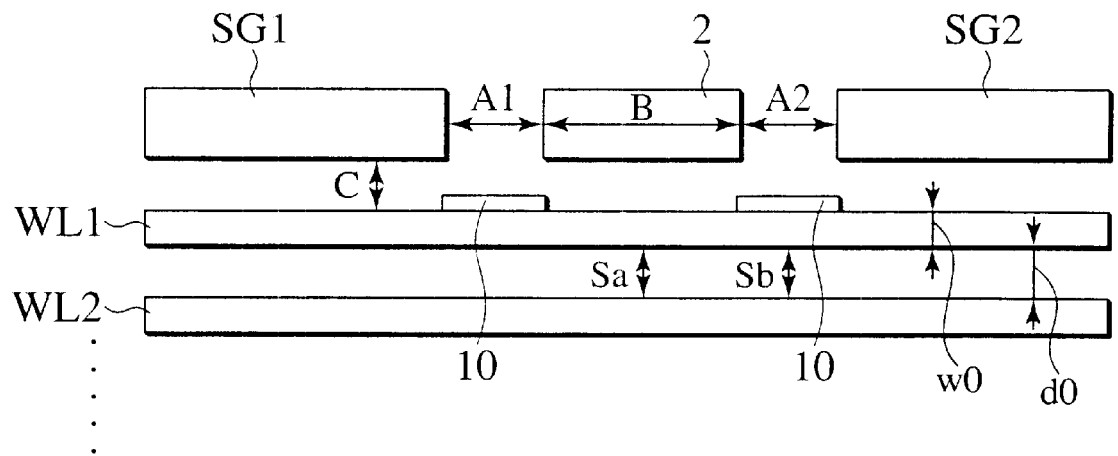
FIG. 4A is an illustration for explaining arrangement parameters A1, A2, and B of a dummy pattern 2 and calculated intervals Sa and Sb between wiring patterns WL1 and WL2.
FIG. 4B is a simulation result of the intervals Sa and Sb in setting the arrangement parameters A1, A2, and B of the second embodiment of the present invention.

As shown in FIG. 4A, the length B of the dummy pattern 2, the interval A1 between the wiring pattern SG1 and dummy pattern 2, and the interval A2 between the wiring pattern SG2 and dummy pattern 2 are changeable as parameters in a photo mask. To simplify the explanation, the project-contracting rate of the photo mask is set to one by one. The values of intervals Sa and Sb between the wirings WL1 and WL2 to be exposed on the semiconductor device are calculated by simulation. The interval Sa is set close to the center of the dummy pattern 2. The interval Sb is set close to the interval A2. The widths w0 of the wiring patterns WL1 and WL2 are set to 0.16 µm on the photo mask. The widths of the wiring patterns SG1 and SG2 are set to 0.3 µm. The interval d0 between the wiring patterns WL1 and WL2 is set to 0.157 µm. In the specification for the developed intervals Sa and Sb, the intervals are set in a range between 0.148 and 0.166 µm (inclusive). It is estimated that a problem in a semiconductor device due to the above intervals is not generated when the intervals are kept with in the above range. The distance c between the wiring patterns WL1 and SG1 (or SG2) is set to 0.2 µm. The interval (A1+B+A2) between the wiring patterns SG1 and SG2 is set to be constant at 2 µm. The length of a pattern 10 added through the light proximity effect correction is equal to the interval A1 or A2 and the width of the pattern 10 is set to a certain value in a range between 0.0001 and 0.02 µm (inclusive).

FIG. 4B shows combinations of the length B and intervals A1 and A2 used for the simulation. The intervals A1 and A2 are set equal to each other. Each numerical value uses the unit µm. An exposure value is set to 40 mJ. Thereby, the intervals Sa and Sb of the wiring patterns WL1 and WL2 to be developed become smaller than the mask dimension. The intervals Sa and Sb decrease as the length B decreases. It has been found that the rate of decrease of the interval Sa is larger than that of the interval Sb. It has been found that the specification for the intervals Sa and Sb is satisfied when the length B is equal to 1.0 µm or more. Moreover, it has been found that it is preferable to set the intervals A1 and A2, respectively, to 0.5 µm or less. Thereby, because the interval (A1+B+A2) between the patterns SG1 and SG2 is 2 µm, it is estimated that it is preferable to set the ratio of the length B to the interval (A1+B+A2) between the patterns SG1 and SG2 to be 0.5 or more. Moreover, it has been found that the specification for the intervals Sa and Sb is satisfied when the intervals A1 and A2 are respectively equal to 0.5 µm or less. The distance c between the pattern WL1 and SG1 (or SG2) is equal to 0.2 µm. Thereby, it is estimated that it is preferable to set the ratio of the interval A1 (or A2) to the distance c to be 2.5 or less. Moreover, it is estimated that it is preferable to set the ratio of the interval A1 (or A2) to the width 0.3 µm of the pattern SG1 (or SG2) to be 1.7 or less. Also, it is estimated that it is preferable to set the ratio of the interval A1 (or A2) to the width 0.16 µm of each of the patterns WL1 and WL2 to be 3.1 or less.

According to the second embodiment, it is possible to improve the degree of integration of a semiconductor device without shorting the gate wirings WL1 to WL4 of the memory cell transistors M1 to M8 with each other.

Modification of Second Embodiment

In the case of a modification of the second embodiment, the shape of the dummy pattern 2 of the first embodiment is changed to the shape of the dummy pattern 12 shown in FIG. 5. That is, the I-shape is changed to an L-shape. Thereby, it is possible to directly obtain the advantage of the second embodiment. Moreover, the dummy pattern 12 is not easily removed from a semiconductor device in the step of forming the dummy pattern 12.

Third Embodiment

Figure 6A:
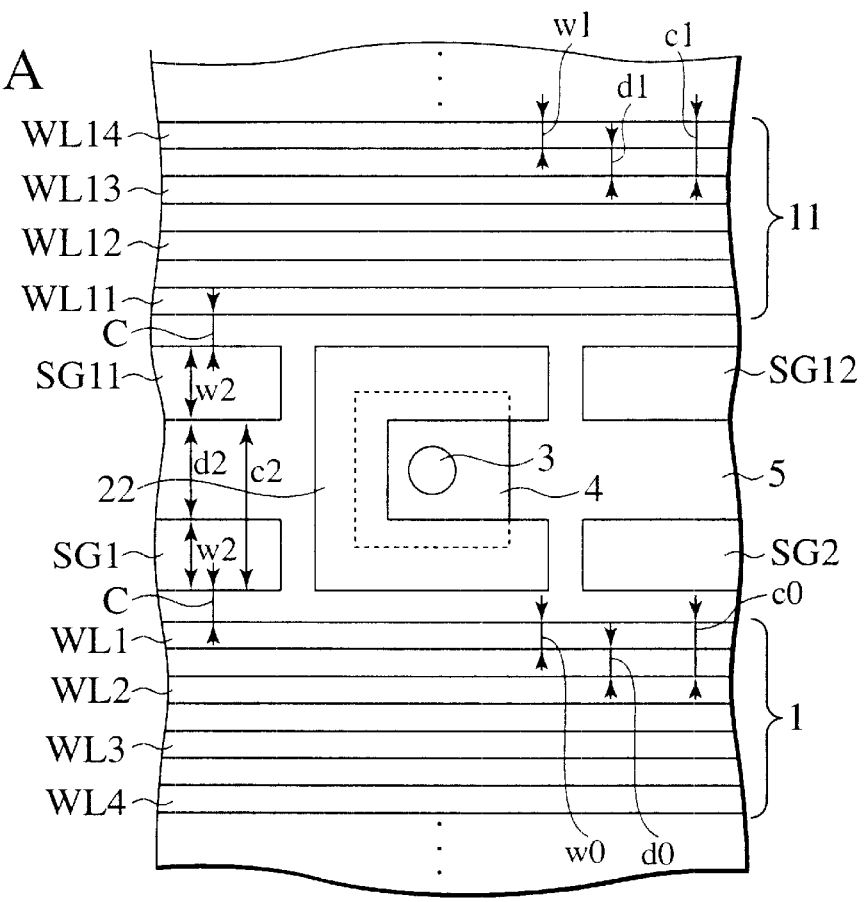
FIG. 6A is a perspective view noting the lowest surface wiring layer when seen through an upper metal interconnect layer and an interlayer dielectric film of a semiconductor device of third embodiment of the present invention.

In the case of the third embodiment, a structure of a NAND EEPROM serving as a semiconductor memory is described. As shown in FIG. 6A, the NAND EEPROM has a structure which is vertically symmetric to the top and bottom with respect to a symmetry line passing through the active area 4. The symmetric top and bottom portions to each other have configurations the same as those of the second embodiment in FIG. 3A and the modification of the second embodiment in FIG. 5.

The dummy pattern 22 of the third embodiment has a shape obtained by connecting two dummy patterns 2 shown in FIG. 3A. That is, a U-shape is obtained by connecting two I-shaped patterns. Thereby, it is possible to directly obtain the advantage of the second embodiment. Moreover, the dummy pattern 22 does not easily detach from a semiconductor device in the step of forming the dummy pattern 22.

The circuit diagram of a NAND EEPROM of the third embodiment includes the circuit diagram of the semiconductor device of the first embodiment shown in FIG. 2C. Wherein, it is necessary to replace the gate wirings WL31 to WL34 with the gate wirings WL1 to WL4. Moreover, because the NAND EEPROM has a structure which is vertically symmetric to the top and bottom, another circuit diagram of the semiconductor device of the first embodiment shown in FIG. 2C is included. Wherein, it is necessary to replace the gate wirings WL31 to WL34 with the gate wirings WL11 to WL14. Moreover, it is necessary to replace the gate wirings SG1 and SG2 with the gate wirings SG11 and SG12.

Figure 7A:
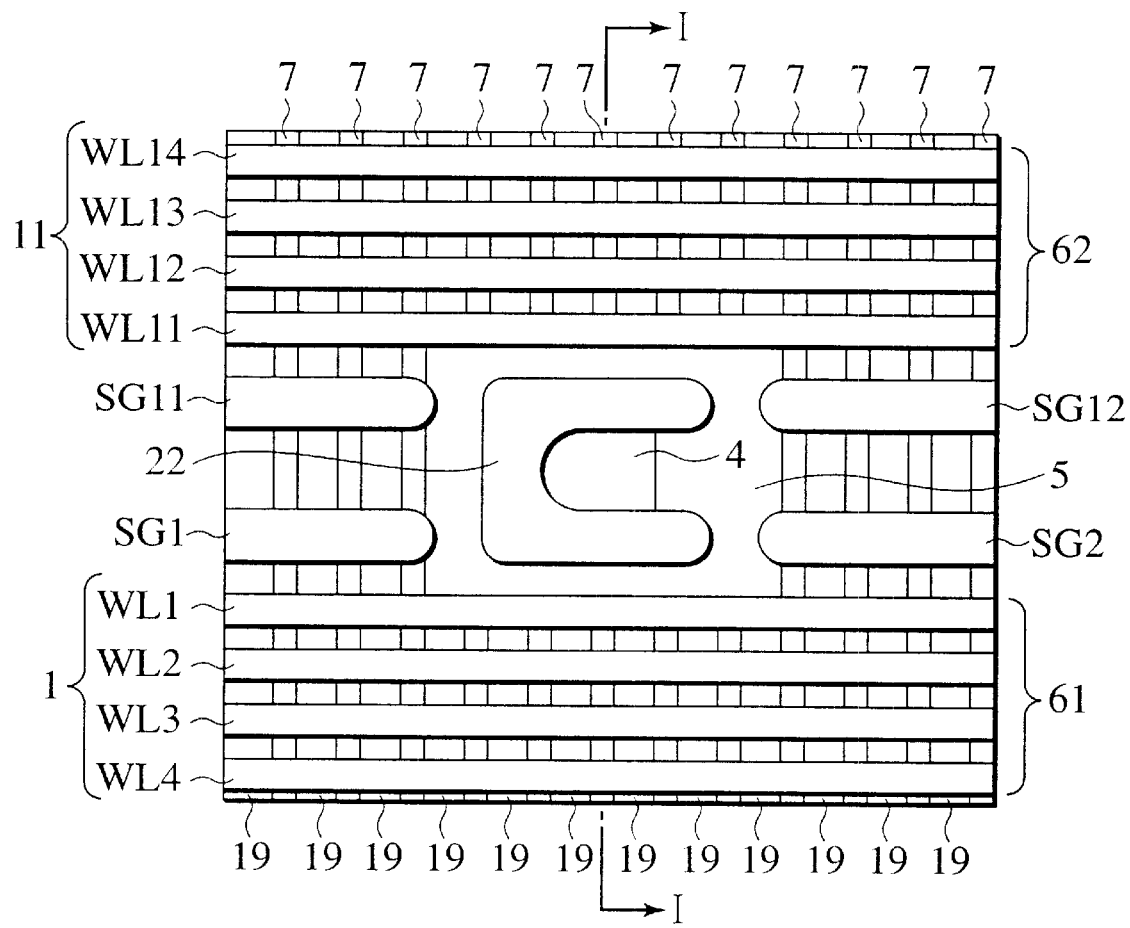
FIG. 7A is a detailed perspective view noting the lowest surface wiring layer when seen through an upper metal interconnect layer and an interlayer dielectric film of the semiconductor device of the third embodiment of the present invention while the device is currently fabricated.

As shown in FIG. 7A and FIG. 2C, the NAND EEPROM has a memory cell array 61. The memory cell array 61 has the memory cell transistors M1 to M8. The memory cell transistors M1 and M5 share the gate wiring WL1. The memory cell transistors M2 and M6 share the gate wiring WL2. The memory cell transistors M3 and M7 share the gate wiring WL3. The memory cell transistors M4 and M8 share the gate wiring WL4. The gate wirings WL1 to WL4 constitute a pattern group 1. The gate wirings WL1 to WL4 are arranged in the pattern group 1 in the longitudinal direction at a period c0. The line widths w0 of the gate wirings WL1 to WL4 are equal to each other. The space widths d0 between the gate wirings WL1 to WL4 are equal to each other. The periodicity c0 is the sum of the line width w0 and the space width d0. The pattern group 1 has a constant width in the transverse direction. The gate wirings SG1 and SG11 and gate wirings SG2 and SG12 are adjacent to the gate wiring WL1 of the pattern group 1 in its longitudinal direction. The length of the gate wirings SG1 and SG11 and gate wirings SG2 and SG12 adjacent to the pattern group 1 is smaller than a constant width of the pattern group 1 in its transverse direction. The gate wirings SG1 and SG11 and gate wirings SG2 and SG12 are arranged at a periodicity c2 different from the periodicity c0. In this case, the periodicity c2 denotes the widths of the repetition units in the longitudinal direction of the gate wirings SG1 and SG11 and wirings SG2 and SG12. Specifically, the line widths w2 of the gate wirings SG1 and SG11 and gate wirings SG2 and SG12 are equal to each other. The space interval d2 between the gate wirings SG1 and SG11 and the space interval d2 between the gate wirings SG2 and SG12 are equal to each other. The periodicity c2 is the sum of the line width w2 and space interval d2. The periodicity c2 is larger than the periodicity c0. The dummy pattern 22 is adjacent to the longitudinal direction of the pattern group 1 in two lines with the gate wirings SG1 and SG11 and gate wirings SG2 and SG12. The dummy pattern 22 is locally formed at the periodicity c2. The dummy pattern 22 is a conductor made of a material the same as the material of the gate wirings SG1 and SG2 and gate wirings SG2 and SG12.

The NAND EEPROM moreover has a pattern group 11 of gate wirings of memory cell transistors. The pattern group 11 serves as part of the memory cell array 62. The pattern group 11 has the gate wirings WL11 to WL14 of memory cell transistors. The gate wirings WL11 to WL14 are arranged at a periodicity c1 in the longitudinal direction. The line widths w1 the gate wirings WL11 to WL14 are equal to each other. The space intervals between the gate wirings WL11 to WL14 are equal to each other. The periodicity c1 is the sum of the line width w1 and space interval d1. It is permissible for the periodicity c1 to be equal to or different from the periodicity c0. The periodicity c1 is smaller than the periodicity c2. The pattern group 11 has a constant width in its transverse direction. It is permissible for that the constant width to be equal to or different from the constant width of the pattern group 1. The gate wirings SG1 and SG11 and gate wirings SG2 and SG12 are adjacent to the longitudinal direction of the gate wirings WL11 of the pattern group 11. The length of the gate wirings SG1 and SG11 and gate wirings SG2 and SG12 adjacent to the pattern group 11 is smaller than the constant width in the transverse direction of the pattern group 11. The dummy pattern 22 is adjacent to the longitudinal direction of the gate wiring WL11 of the pattern group 11 separated by the distance c. The width of the region of the dummy pattern 22 separated from the gate wiring WL11 in its longitudinal direction by the distance c is equal to the width w2.

The dummy pattern 22 does not increase or decrease the thickness of the gate wirings WL1 to WL4 and WL11 to WL14 by scattering of light during lithography processing.

Figure 6B:
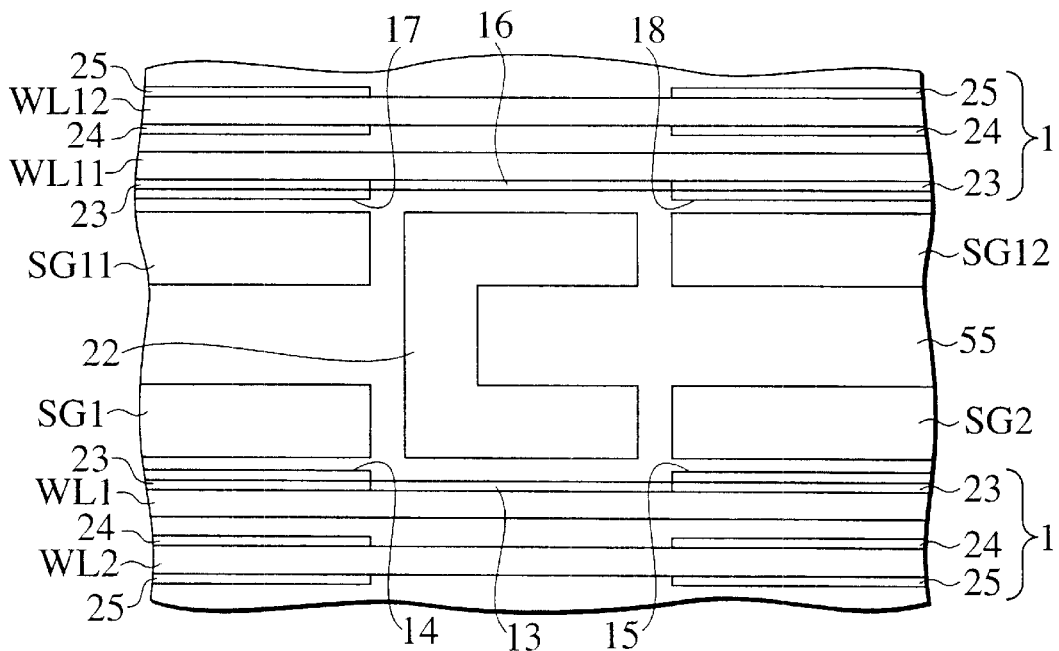
FIG. 6B is a mask pattern diagram of a photo mask used to fabricate the semiconductor device of the third embodiment of the present invention.

As shown in FIG. 6B, the dummy pattern 22 is formed in the photo mask. Moreover, it is permissible to arrange patterns 13 to 18 added according to the light proximity effect correction. Furthermore, it is permissible to arrange patterns 23 to 25, respectively to serve as a bias. It is preferable to set the widths of the patterns 13 to 18 and 23 to 25 to values ranging between 0.0001 and 0.02 $\mu$m (both inclusive).

Figure 7B:
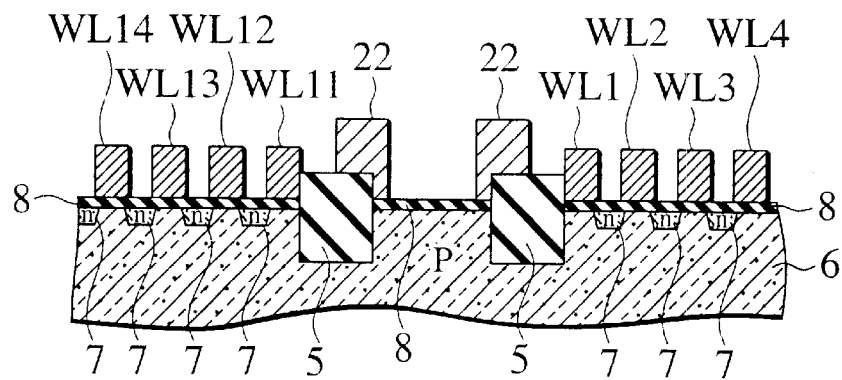
FIG. 7B is a sectional view of the semiconductor device of the third embodiment of the present invention while the device is currently fabricated in the I—I direction of FIG. 7A.

The gate wirings WL1 to WL4, WL11 to WL14, SG1, SG2, SG11, and SG12 and the dummy pattern 22 shown in FIG. 7A and FIG. 7B are formed by using the photo mask shown in FIG. 6B. The memory cell transistors M1 to M8 are separated from each other by isolation regions 19. The select transistors ST1 and ST2 are also separated from each other by the isolation regions 19. The gate wirings WL1 to WL4 and WL11 to WL14 are respectively formed at a uniform width without being disconnected or shorted.

The gate wirings WL1 to WL4 and WL11 to WL14, SG1, SG2, SG11, and SG12 and the dummy pattern 22 shown in FIG. 7A are formed by using the photo mask shown in FIG. 6B and changing exposure conditions. As shown in FIG. 8A, exposure values and focuses are changed due to exposure conditions. For example, a space at focus −0.4 $\mu$m and at exposure value 29 (relative value) is blank. This blank means that no pattern is formed under the above exposure condition. A symbol × appears in a space at focus −0.3 $\mu$m and at exposure value 29 (relative values). This symbol × means that a pattern formed under this exposure condition does not satisfy the specification. A symbol @ appears in a space at focus −0.2 $\mu$m and at exposure value 29 (relative values). This symbol @ means that a pattern formed under this exposure condition satisfies the specification. Thereby, it is determined that the specification is satisfied even if the exposure value and focus greatly fluctuate.

The above analysis is compared with the case of FIG. 8B which does not use a photo mask with the dummy pattern 22. A photo mask excluding only the dummy pattern 22 from the photo mask shown in FIG. 6B is used. The exposure condition is the same as that in FIG. 8A.

In the case of the comparison at an exposure value of 32 (relative values), when the dummy pattern 22 is absent, a focus margin is equal to an interval of 0.1 $\mu$m between −0.3 and −0.2 $\mu$m. However, when the dummy pattern 22 is present, the focus margin is equal to an interval of 0.6 $\mu$m between −0.5 and +0.1 $\mu$m. Therefore, it is determined that the focus margin is increased. Moreover, it is determined that the exposure value margin is increased. In the case of the comparison at a focus of −0.1 $\mu$m, when the dummy pattern 22 is absent, exposure can be made only at an exposure value 31 (relative values) but there is no exposure margin. However, when the dummy pattern 22 is present, an exposure-value margin is equal to interval 5 (relative value) between 29 and 34 (relative values).

According to the third embodiment, the degree of integration of a NAND EEPROM can be improved without shorting gate wirings of the memory cell transistors M1 to M8.

First Modification of Third Embodiment

In the case of the first modification of the third embodiment, the shape of the dummy pattern 22 of the third embodiment shown in FIG. 6A is changed to the shapes of the dummy patterns 26 and 27 shown in FIG. 9. That is, a U-shape is changed to two L-shapes. Thereby, it is possible to directly achieve the advantage of the third embodiment.

Second Modification of Third Embodiment

In the case of the second modification of the third embodiment, the shape of the dummy pattern 22 of the third embodiment shown in FIG. 6A is changed to the shape of the dummy pattern 28 shown in FIG. 10. That is, a U-shape is changed to an O-shape. Thereby, it is possible to directly achieve the advantage of the third embodiment.

Third Modification of Third Embodiment

In the case of the third modification of the third embodiment, the shape of the dummy pattern 22 of the third embodiment shown in FIG. 6A is changed to the shape of the dummy pattern 29 shown in FIG. 8. That is, a U-shape is changed to an H-shape. Thereby, it is possible to directly achieve the advantage of the third embodiment. Moreover, it is possible for the structure to correspond to a case in which two or more well contacts 3 are provided.

Fourth Embodiment

Though gate wirings are used for the second and third embodiments, it is also permissible for metal wirings to be used as long as they form a pattern. Moreover, the pattern is not restricted to a conductor. For example, the pattern can be applied to an insulator serving as a sidewall of a damascene wiring. In the case of the semiconductor device of the fourth embodiment, the use of metal wirings is described. As shown in FIG. 12A and FIG. 12B, metal wirings L1 to L4 are arranged in the longitudinal direction at periodicity c1 as a pattern group 1. The pattern group 1 has a constant width in the transverse direction. Metal wirings 43 and 45 and metal wirings 42 and 44 are adjoined in the longitudinal direction of the metal wiring L1 of the pattern group 1 by a distance c. The length of the metal wirings 43 and 45 and metal wirings 42 and 44 adjacent to the pattern group 1 is smaller than the constant width of the pattern group 1 in its transverse direction. The metal wirings 43 and 45 and metal wirings 42 and 44 are arranged at a periodicity c2 different from a periodicity c0. A dummy pattern 41 is positioned in parallel with the metal wirings 43 and 45 and metal wirings 42 and 44 separately by the distance c in the longitudinal direction of the pattern group 1. The dummy pattern 41 is also formed at the periodicity c2. Metal wirings L11 to L14 are arranged as a pattern group 11 in the longitudinal direction at the periodicity c1. The pattern group 11 has a width constant in a transverse direction. The metal wirings 43 and 45 and metal wirings 42 and 44 are adjoined in the longitudinal direction of the pattern group 11 separately by the distance c. The dummy pattern 41 is adjoined in the longitudinal direction of the pattern group 1 separately by the distance c. The width of the region in which the dummy pattern 41 is adjoined in the longitudinal direction of the pattern group 1 separately by the distance c is equal to the width w2 of each of the metal wirings 44 and 45. The width of the region in which the dummy pattern 41 is adjoined in the longitudinal direction of the pattern group 11 separately by the distance c is equal to the width w2 of each of the metal wirings 42 and 43.

As shown in FIG. 12B, the metal wirings L1 to L4, L11 to L14, and 42 to 45 are arranged on an interlayer dielectric film 48. An interlayer dielectric film 46 is formed on the metal wirings L1 to L4, L11 to L14, and 42 to 45. A plug 53 is formed on the metal wiring 42 by passing through the interlayer dielectric film 46. A metal wiring 54 is formed on the plug 53. An interlayer dielectric film 49 is formed on the metal wiring 54. A metal wiring 51 is formed on an interlayer dielectric film 47. A plug 52 is formed below the metal wiring 43 on the metal wiring 51. An interlayer dielectric film 48 is formed on the interlayer dielectric film 47. Power can be supplied to the metal wiring 42 through the plug 53 and metal wiring 54. Moreover, power can be supplied to the metal wiring 43 through the plug 52 and metal wiring 51. However, the dummy pattern 41 is not connected with other wiring but it is kept in an electrically floating state.

Because the dummy pattern 41 is formed, the thickness of the metal wirings L1 to L4 and L11 to L14 is not increased or decreased due to scattering of light during lithography processing. The dummy pattern 41 is not limited to the U-shape in FIG. 12A but may also be any one of the I-, L-, O-, and H-shapes shown in FIG. 3A and FIG. 9 to FIG. 11. Thereby, the same advantage as that of the third embodiment can be achieved.

Moreover, in the case of the second to fourth embodiments, it is permissible for two or more of the I-, L-, U-, O-, and H-shaped dummy patterns shown for the second to fourth embodiments to be combined.

According to the fourth embodiment, it is possible to improve the degree of integration of a semiconductor device without shorting its wirings.

The present invention may be embodied in other forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:
   a semiconductor substrate;
   a first insulating film formed on the semiconductor substrate;
   a first pattern group having a plurality of first conductors formed on the first insulting film, respectively having a first width and separated from each other by a first interval;
   a second conductor formed separately from a first conductor of the plurality of first conductors at an end of the first pattern group by a first distance in parallel with the plurality of first conductors and having a second width larger than the first width;
   a third conductor formed on the same side as the second conductor with respect to the first pattern group and separated from the first conductor by the first distance and having a width equal to the second width; and
   a fourth conductor formed between the second and third conductors and separated from the first conductor by the first distance and having a width equal to the second width.

2. The semiconductor device as claimed in claim 1, further comprising an insulator thicker than the first insulating film, formed on the semiconductor substrate, wherein the fourth conductor is formed on the insulator.

3. The semiconductor device as claimed in claim 2, further comprising a second insulating film surrounded by the insulator, formed on the semiconductor substrate, wherein the fourth conductor is formed on the second insulating film.

4. The semiconductor device as claimed in claim 3, further comprising a fifth conductor formed on the semiconductor substrate at an opposite side of the first pattern group to the fourth conductor and contacting the second insulating film.

5. The semiconductor device as claimed in claim 3, wherein the fourth conductor has a length larger than a width of the second insulating film.

6. The semiconductor device as claimed in claim 1, wherein conductivity of the semiconductor substrate below gaps of the first conductors is different from conductivity of the semiconductor substrate below the first conductors.

7. The semiconductor device as claimed in claim 1, further comprising:
   a sixth conductor formed at an opposite side of the first pattern group with respect to the second conductor and separated from the second conductor by a second distance and having a width equal to the second width;
   a seventh conductor formed at the opposite side of the first pattern group with respect to the third conductor and separated from the third conductor by the second distance and having a width equal to the second width;
   a third insulating film formed on the semiconductor substrate; and
   a plurality of eighth conductors arranged on the third insulating film at an opposite side of the second conductor with respect to the sixth conductor and separated from the sixth conductor by the first distance, respectively having a second width, and separated from each other by a second interval;
   wherein the fourth conductor is formed on the same side as the sixth conductor with respect to the eighth conductors and separated from the eighth conductors by the first distance and a region of the fourth conductor formed between the sixth and seventh conductors has a width equal to the second width.

8. The semiconductor device as claimed in claim 7, wherein the second interval is equal to the first interval and the second width is equal to the first width.

9. The semiconductor device as claimed in claim 7, wherein the fifth conductor is formed on the semiconductor substrate at an opposite side of the eighth conductors with respect to the fourth conductor.

10. The semiconductor device as claimed in claim 7, wherein conductivity of the semiconductor substrate below gaps of the eighth conductors is different from conductivity of the semiconductor substrate below the eighth conductors.

11. The semiconductor device as claimed in claim 1, wherein the semiconductor device is a memory device, and the plurality of first conductors are word lines.

12. The semiconductor device as claimed in claim 11, wherein the semiconductor device is a NAND EEPROM.

13. A semiconductor device comprising:
   a semiconductor substrate;
   a first memory cell array having a plurality of first gate wirings in parallel with each other formed on the semiconductor substrate and separated from each other by an interval and respectively having a first width;
   a first select transistor having a second gate wiring with a second width different from the first width and formed on the semiconductor substrate adjacent to the first memory cell array in parallel with the first gate wirings;
   a second select transistor having a third gate wiring formed on the semiconductor substrate adjacent to the first memory cell array on the same side as the first select transistor with respect to the first memory cell array on an extension line of the second gate wiring; and
   a dummy pattern formed adjacent to the first memory cell array between the second gate wiring and the third gate wiring in parallel with the first gate wirings and having a width equal to the second width.

14. The semiconductor device as claimed in claim 13, further comprising a second memory cell array having a plurality of fourth gate wirings formed on the semiconductor substrate adjacent to the first select transistor and the second select transistor, separated from each other by the interval in parallel with each other, and respectively having a width equal the first width.

15. The semiconductor device as claimed in claim 14, wherein the dummy pattern is adjacent to the second memory cell array in parallel with the fourth gate wirings.

16. The semiconductor device as claimed in claim 13, further comprising a contact plug formed on the semiconductor substrate adjacent to the dummy pattern at an opposite side of the first gate wirings with respect to the dummy pattern.

17. The semiconductor device as claimed in claim 15, further comprising a contact plug formed on the semiconductor substrate adjacent to the dummy pattern at an opposite side of the first gate wirings with respect to the dummy pattern and at an opposite side of the fourth gate wirings with respect to the dummy pattern.

18. The semiconductor device as claimed in claim 13, wherein the semiconductor device is a NAND EEPROM.

* * * * *